US008843865B2

(12) United States Patent
Tai et al.

(10) Patent No.: US 8,843,865 B2
(45) Date of Patent: Sep. 23, 2014

(54) DATA FLOW ANALYZER (75) Inventors: Philip H. Tai, Cupertino, CA (US);
Pedja Raspopovic, Cary, NC (US);
Jaime Wong, San Jose, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 13/405,302

(22) Filed: Feb. 26, 2012

(65) Prior Publication Data

US 2013/0227503 A1 Aug. 29, 2013

(51) Int. Cl.
*G06F 17/50* (2006.01)
(52) U.S. Cl.
USPC .......................................................... 716/110
(58) Field of Classification Search
USPC .................................................. 716/100, 110
See application file for complete search history.

(56) References Cited

U.S. PATENT DOCUMENTS

| 6,836,877 | B1 * | 12/2004 | Dupenloup | .................... | 716/103 |
| 8,209,649 | B2 * | 6/2012 | McIlrath | ........................ | 716/110 |
| 2004/0002831 | A1 * | 1/2004 | Wendel et al. | ................. | 702/119 |
| 2009/0055789 | A1 * | 2/2009 | McIlrath | ........................ | 716/10 |
| 2011/0060546 | A1 * | 3/2011 | Miller et al. | .................... | 702/120 |
| 2011/0314437 | A1 * | 12/2011 | McIlrath | ........................ | 716/139 |
| 2012/0054703 | A1 * | 3/2012 | Pikus et al. | .................... | 716/107 |
| 2012/0317528 | A1 * | 12/2012 | McIlrath | ........................ | 716/112 |
| 2013/0198703 | A1 * | 8/2013 | Lu et al. | ........................ | 716/107 |

OTHER PUBLICATIONS

Cadence Datasheet, "SoC Encounter RTL-to-GDSI I System", 2009 Cadence Design Systems, Inc., 4 pages.
Magma Design Automation, Hydra tm, 2009 Magma Design Automation, Inc., 4 Pages.
Olympus-SoC Datasheet, "Solving Advanced Node Design Challenges", 2011 Mentor Graphics Corporation, 2 pages.

* cited by examiner

*Primary Examiner* — Suchin Parihar
(74) *Attorney, Agent, or Firm* — Kilpatrick Townsend & Stockton LLP (57) ABSTRACT

A system and method for generating physical design of an integrated circuit, based on schematic design. The system includes graphical user interface and integrated circuit design and layout system. The integrated circuit design and layout system creates and analyzes logical slices of the integrated circuit based on the schematic design; creates and edits macros based on the logical slices; and traces and analyzes data paths through the physical design based on the schematic design. The method includes providing the schematic design of the integrated circuit, and generating logical slices of the integrated circuit from the schematic design. The method also includes generating, grouping and manipulating macros, responsive to identification of multiple occurrences of logical slices. The method further includes performing data flow analysis to identify data paths for the physical design, quantifying weight indices for the data paths, and positioning objects in the physical design based on the weight indices.

21 Claims, 6 Drawing Sheets

DATA FLOW ANALYZER

TECHNICAL FIELD

Embodiments of the disclosure relate to the field of integrated circuit design and layout.

BACKGROUND

Semiconductor integrated circuit design can be thought of as a collaboration between circuit schematic designers and physical designers.

Initially, a system level designer creates a functional specification of what a user wants the integrated circuit (hereinafter also referred to as IC or chip) to do. Various known computer-implemented tools and languages, such as MATLAB, Sinulink, Verilog systems, can be used to generate the functional specification. A Register Transfer Level (RTL) design is then produced, which describes operation of circuitry on the chip, and interconnections to chip inputs and outputs. The RTL design specifies flow of signals or transfer of data between circuit elements, for example logic gates or hardware registers, and further specifies logical operations performed on such signals.

A circuit schematic designer designs the functionality of a circuit, using schematic representations of circuit components and modules. The circuit schematic designer also designs interconnections between the circuit components and modules, where the interconnections are in form of a topology. The topology is abstract, meaning that a given interconnection between two components does not show relative positions of the components, or distance of an interconnection path between the components, but merely that there is an interconnection between the components. The schematic design can be in the form of a netlist, which represents the components and the modules, with respective input and output contact points, and the interconnections between contact points of various components and modules. Thus, a data flow can be deduced, at a schematic level, for the components, the modules, and the interconnections in the schematic design.

A physical designer prepares a layout for the IC, with circuit topology the chip would have. In a physical design, the components and the modules are positioned relative to each other, and shape, size, length, of interconnections between the components and the modules are specified. The physical designer takes the RTL design, and a library of available circuit components, for example logic gates, and creates a physical chip design. This involves figuring out which gates to use, defining locations for the gates, and wiring the gates together. The physical design is sometimes referred to as a floorplan for the integrated circuit. The physical design step does not affect functionality of the integrated circuit, but does substantially influence circuit operating parameters, for example operation speed of the chip operates, and what will be the cost of fabrication of the chip.

Physical designers typically collaborate with RTL designers to produce a floorplan which optimizes data flow through chip components and modules, and from the chip inputs to the chip outputs. For instance, the physical designers might manually trace and draw net connectivity and data flow pathways, and then consult RTL designers to verify correctness of the data flow. Due to the large size of many IC design netlists, and to the difficulty and complexity of macro editing tasks used in physical design process, analysis of design netlist data flow is time-consuming, and often requires multiple collaborative iterations between the physical and RTL designers. Hence, efficiency of the physical design process is desirable.

SUMMARY

An example of a system for generating a physical design of an integrated circuit based on a schematic design includes a graphical user interface and an integrated circuit design and layout system configured to create and analyze logical slices of the integrated circuit based on the schematic design, to create and edit macros based on the logical slices, and to trace and analyze data paths through the physical design based on the schematic design. The integrated circuit design and layout system thereby generates the physical design in terms of the logical slices, the macros, and the analysis of the data paths.

An example of a computer program product for directing a computer system having a graphical user interface to generate a physical design of an integrated circuit, based on a schematic design, includes a computer-readable medium. The computer program product also includes computer program software, provided on the computer-readable medium, for directing the computer system to create and analyze logical slices of the integrated circuit based on the schematic design; to create and edit macros based on the logical slices; to trace and analyze data paths through the physical design based on the schematic design; and to generate the physical design in terms of the logical slices, the macros, and the analysis of the data paths.

An example of a method for generating a physical design of an integrated circuit, based on a schematic design, includes providing the schematic design of the integrated circuit and generating logical slices of the integrated circuit from the schematic design. The method also includes generating, grouping and manipulating macros, responsive to identification of multiple occurrences of logical slices. The method further includes performing a data flow analysis to identify data paths for the physical design. Moreover, the method includes quantifying weight indices for the data paths and positioning objects in the physical design based on the weight indices.

Further features and advantages of embodiments of the present subject matter, as well as the structure and operation of preferred embodiments disclosed herein, are described in detail below with reference to the accompanying exemplary drawings.

BRIEF DESCRIPTION OF THE VIEWS OF DRAWINGS

In the accompanying figures, similar reference numerals may refer to identical or functionally similar elements. These reference numerals are used in the detailed description to illustrate various embodiments and to explain various aspects and advantages of the present disclosure.

DETAILED DESCRIPTION

A data flow analyzer, in an embodiment as per the present disclosure, enables a user to extract data flow information, using intuitive operations and receiving intuitive visual information and cues in a graphical representation with a logic module viewer. This enables designers to break large designs into manageable pieces, and to analyze data flow relationship directly from a netlist, without having to consult Register Transfer Level (RTL) designers. In an embodiment, macro editing utilities and an input/output (IO) to macro netlist data path tracer, help the designers to understand and analyze the quality and performance of physical design with its specified macro locations. A macro array editor further speeds up design process to create an IC floorplan which optimizes data flow.

In an embodiment, the data flow analyzer (DFA) abstracts physical design information into easy to understand data flow blocks, to provide designers with intuitive information and understanding of logical hierarchies and physical partitions in an IC physical design. Such information and understanding facilitates quick development of a physical design floorplan and with few design iterations. This helps the user ensure that a resultant IC has optimal values for predetermined operating parameters of interest, for example speed of operation and data throughput.

Figure 1:
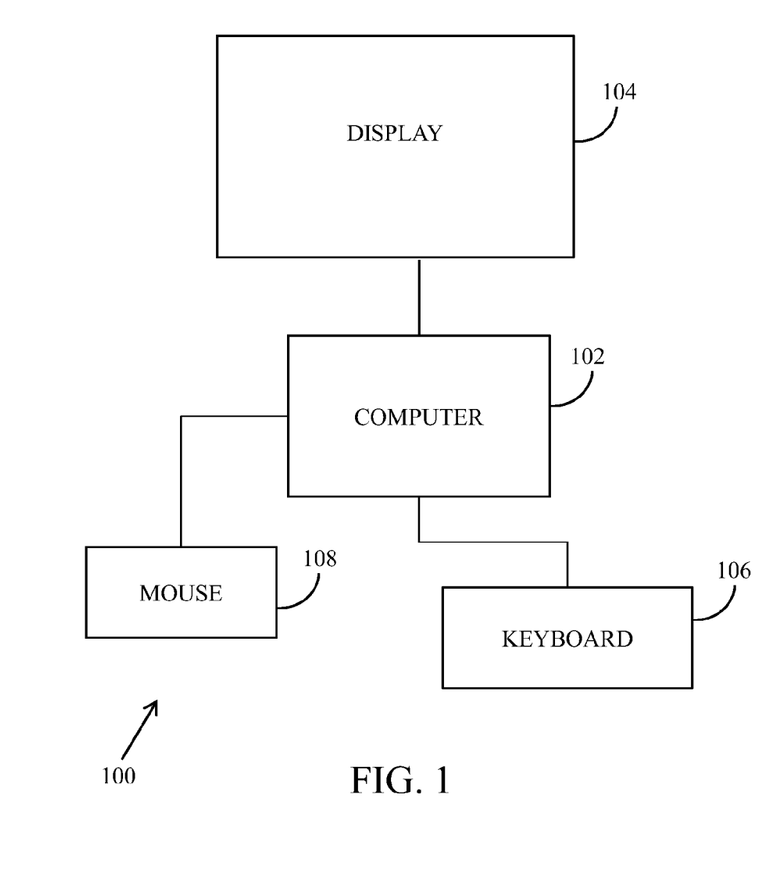
FIG. 1 is a block diagram of a processing system, in accordance with which various embodiments can be implemented.

An embodiment of the data flow analyzer disclosed herein can be implemented in a processing system 100, as shown in FIG. 1. The processing system 100 or a computer system includes a computer 102 having a processor and system memory. A user interface can include a graphical user interface (GUI) system having a display 104, which illustrates graphical images in a format such as that of Windows. User input devices, for example a keyboard 106 and a mouse 108, enable the user to manipulate a displayed graphical image. For instance, the user can move a circuit component in a displayed physical design by mouse-clicking to select the circuit component, by dragging and dropping the circuit component to reposition it, by clicking (for instance, right-clicking) to call up a menu of component parameters or available functions.

Another embodiment can be a method for producing an integrated circuit (IC) physical layout, including doing data flow analysis as described herein.

Yet another embodiment can include a computer program product, that is a computer-readable medium, for example a CD-ROM, bearing software program code, readable by a general purpose computer system or the processing system 100, for directing the computer to operate as the data flow analyzer as described herein. Such use of the computer program product with a general-purpose computer system in a manner would be known to a person of ordinary skill in the art. Such a computer program product bears software for execution by the general purpose computer system. By executing the software, the general purpose computer system implements a design layout method in accordance with yet another embodiment.

Figure 2:
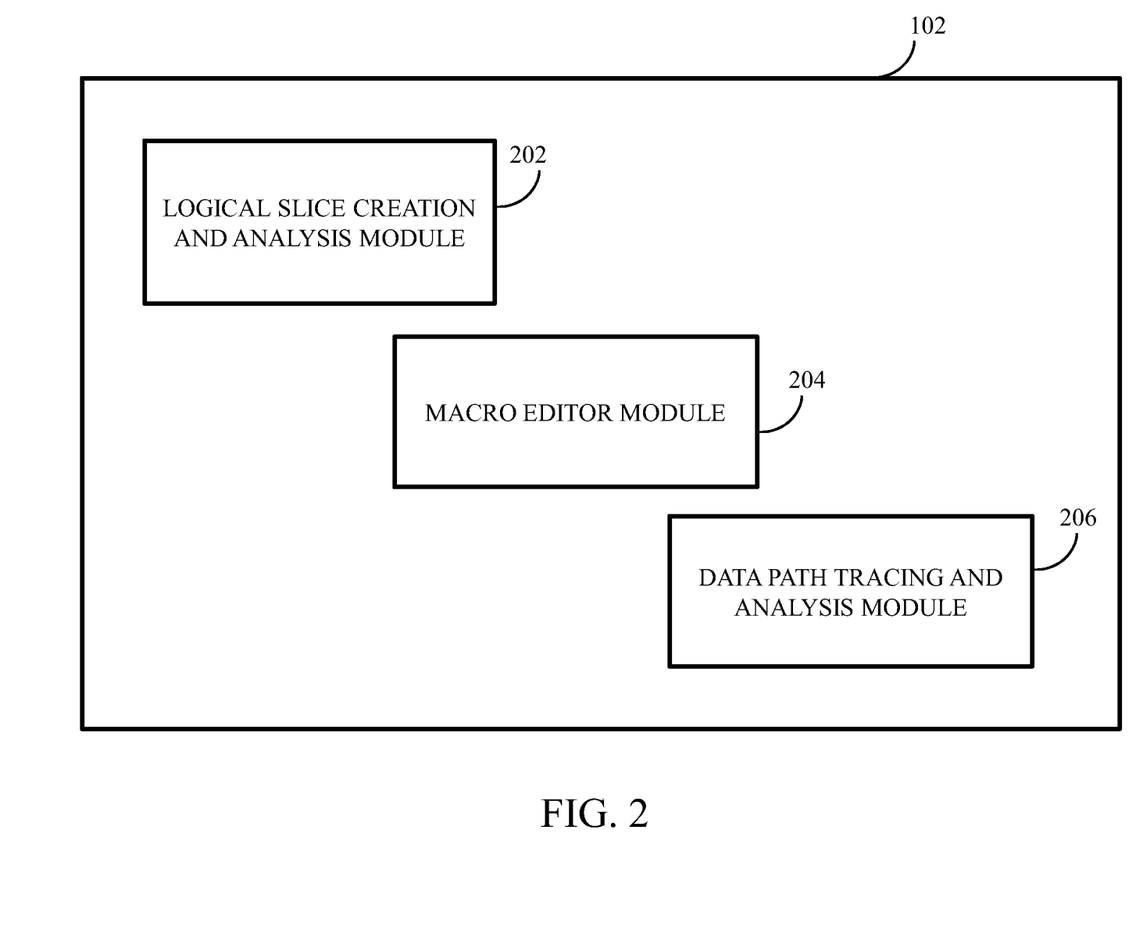
FIG. 2 is a block diagram of a computer of a processing system, in accordance with one embodiment.

FIG. 2 is a block diagram of a portion of the processing system 100, illustrating in more detail functional modules of the computer 102 according to an embodiment. The computer 102 includes logical slice creation and analysis module 202, a macro editor module 204, and a data path tracing and analysis module 206. Functions of each module is described in more detail below.

Physical Design Block Diagrams; User-Selectable Functions

Figure 3:
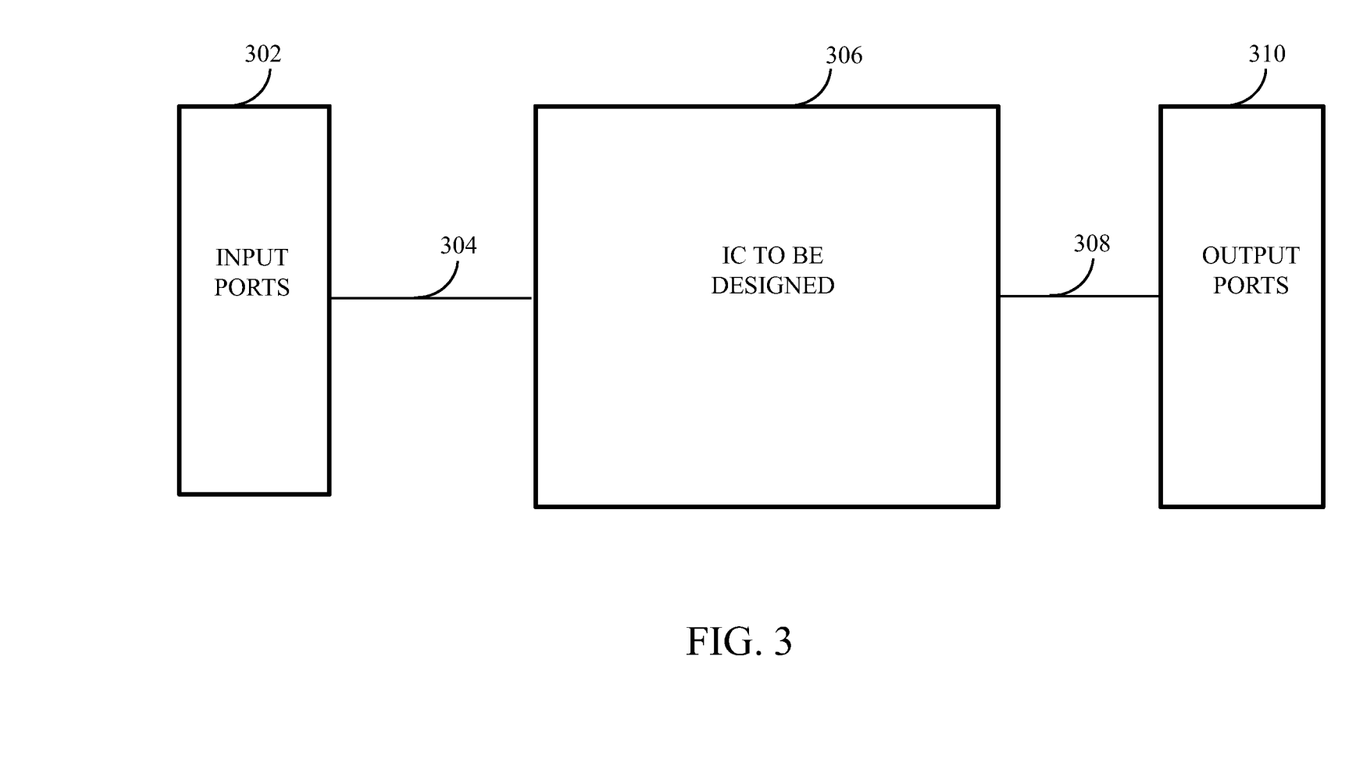
FIG. 3 illustrates a display of a physical design of an integrated circuit on a processing system, in accordance with one embodiment.

FIG. 3 is a block diagram, as it would be displayed in a GUI window for example, illustrating an initial screen shot of an IC which is to be a subject of a physical design. (Particular details of a Windows-type window frame, for example a title bar, minimize and close click buttons, and pull-down menus, are omitted here, but will be understood by persons skilled in the use of Windows-type GUIs).

The elements of FIG. 3, to be described, are shown in high-level schematic form as blocks and connection lines. Input ports, shown schematically as 302, are coupled through an input connection 304 to the IC to be designed, which is shown schematically as 306. An output connection 308 is coupled from the IC 306 to output ports, shown schematically as 310. The connections 304 and 308, and similar connections in other drawings, will also be referred to herein as flylines. Also, the various components and modules, such as the modules 302, 306, and 310 shown here, and the various other modules shown in other drawings, will also be referred to as logical slices of the IC physical design. The term flylines, as used herein without limitation, can include connections between logical slices, components, and modules, connections between modules and sub-modules, connections between parent and child modules and between sibling modules of a parent module, connections to external interfaces, and other types of connections that would be understood by a person of ordinary skill in the art.

Information concerning these displayed schematic elements can be displayed, or may be selected by the user by means of mouse clicking, right-clicking, in one example to call up information menus. For example, a number of input or output ports, or corresponding individual names, can be selected by clicking on the input ports 302 or the output ports 310. A number of input or output net connections can be obtained similarly, by selecting the connections 304 or 308.

Logical Slice Creation and Analysis

In the discussion which follows, additional details are made available to the user by selecting individual elements of FIG. 3, by using pull-down menus or other user interface tools shown in Windows-type GUIs. For example, if the user selects a module by a mouse right-click on the module of interest, a menu can appear. The menu might, for instance, show a hierarchical list of sub-modules, for example children, within the selected module. The sub-modules can be listed by name, size or area, and various types of macro information concerning the sub-modules. This information can, for instance, be in the form of lines of text, or in the form of iconic symbols, or some combination thereof. Additionally, the sub-modules can be shown as blocks having interconnections. The effect, then, would be for the GUI to replace the single module block with a set of sub-module blocks and the interconnections. The modules and sub-modules, as displayed, can be of sizes and shapes proportional to the size and shape of the physical layout of the modules or sub-modules, for instance proportional in size to the different gate counts of the various sub-modules. The modules or sub-modules can be individually selected. For example, selection by means of mouse-clicking, can be reflected by a change in color-coding of the displayed sub-module.

Figure 4:
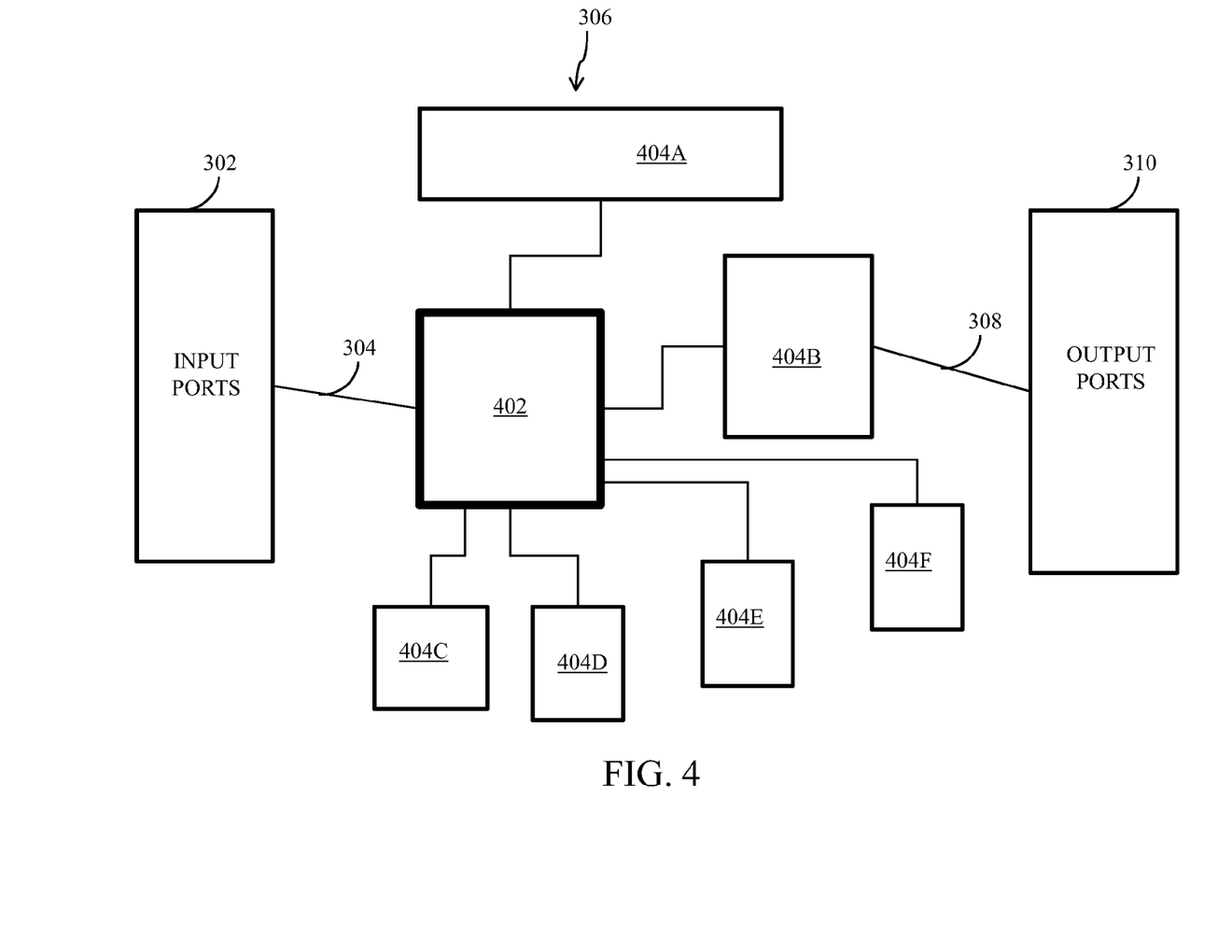
FIG. 4 illustrates a display of a physical design of an integrated circuit in which a module has been broken out into sub-modules, in accordance with one embodiment.

An example is illustrated in FIG. 4, which is another screen shot (omitting the window frame as above). For instance, if the user selected the IC 306, the result can be a break-out of various sub-modules of the IC 306, coupled between the input and output ports 302 and 310, as before. However, the various sub-modules of the IC 306 are shown with respective sizes and interconnection topologies.

If the user selects one of the sub-modules, the selected sub-module can be visually set off from the rest of the sub-modules, by one or more of color-coding, and bolding. For example, a sub-module 402 is illustrated as bolded more heavily than the other sub-modules (not individually numbered) to indicate visually that the sub-module 402 has been selected. The remaining, non-selected sub-modules of the IC 306 are labeled as 404A, 404B, 404C, 404D, 404E, and 404F. The user can manipulate the selected sub-module 402, for example by using the mouse to drag and drop, and the connection topology (for instance, the various connecting lines coupling the selected sub-module 402 to other sub-modules) moves along with the movement of the selected sub-module 402. A color coding or other visual cueing scheme can be used to indicate a hierarchy of modules, having parent-child relationships. Also, a latch display mode can be selected by the user, in which connections are shown only on the selected module, or in which connections on the selected module are shown in detail, while connections elsewhere within the displayed physical design are shown more simply, such as with single flylines that omit any additional information for example connection count.

In an embodiment, GUI functionality is provided, to allow the user to perform automatic module partitioning. The user can use the automatic module partitioning, to create logical slices from a selected module, and to do separate analysis and modification of the logical slices. For example, in an embodiment employing a Windows-type GUI, a pull-down menu of functions can include an automatic hierarchy detection function. When the user selects this function, a list can appear, showing selectable maximum and minimum counts of a number of macros within a given partitioned slice, and selectable minimum and maximum slice areas. Subject to such user-selectable constraints on these or other suitable parameters, the embodiment performs the partitioning of the selected module. The resultant set of the logical slices produced by the partitioning is then shown in the display window. Also, another pull-down-menu-selectable function can be to save or load such module logical slices.

Connectivity Between Modules; "Flylines"

Figure 5:
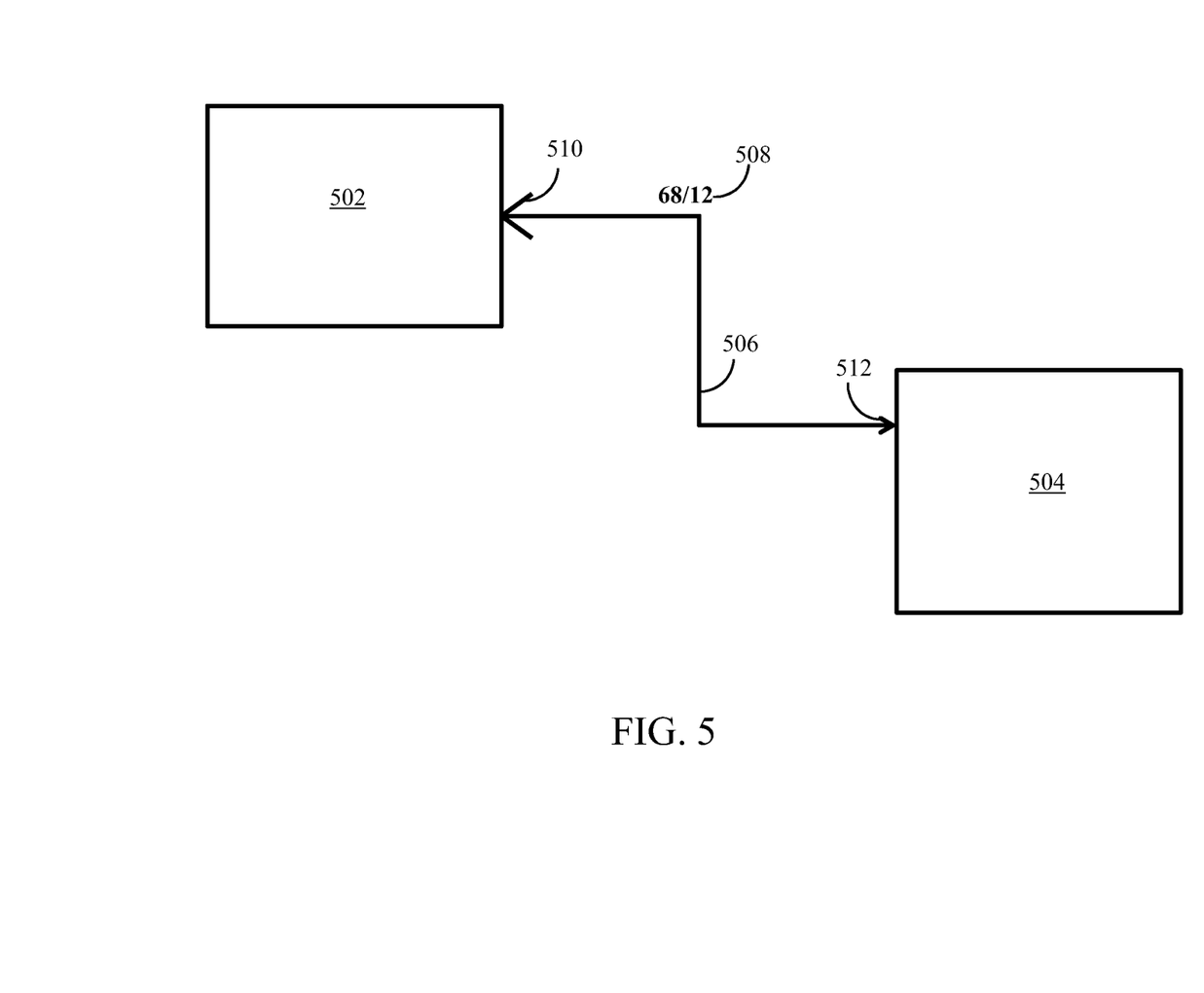
FIG. 5 illustrates a display of a portion of a physical design of an integrated circuit, in accordance with one embodiment.

Connectivity between modules, represented in FIGS. 3 and 4 by flylines, are now analyzed in detail. In one example, when a user selects a flyline, such as by right-clicking or simply by moving the mouse cursor onto the flyline, information appears in the graphical display. An example is illustrated in FIG. 5. Blocks 502 and 504 are connected with a flyline 506. A user selects the flyline 506, for example by right-clicking on it. In response, connectivity analyzer display information is shown.

In one embodiment, such information can include a numerical count of the number of connections represented by the flyline. If number of contacts to the two blocks are not similar (for instance, if an output contact of one module is bussed to several input contacts of the other module, or if the connections are bidirectional), then the connectivity analyzer display information which is displayed, can include two different numbers, for example in an ordered-pair relationship, to illustrate the different numbers of contacts. In FIG. 5, a numerical count 508 is displayed, in the form of an ordered pair "68/12". A visual cue, such as arrowheads of differing sizes, boldness, etc., can also be displayed on opposite ends of the flyline 506 to indicate which module has a greater number of connections. In the example of FIG. 5, a large arrowhead 510 on the end of the flyline 506 connected to the block 502 signifies that 68 connections run from the flyline 506 to the block 502. Similarly, a smaller arrowhead 512 on the end of the flyline 506 connected to the block 504 signifies that 12 connections run from the flyline 506 to the block 504. Such detailed connectivity information can be provided between any flyline-connected modules, for example between parent and child modules.

Also, a user-selectable option, for example, a pull-down menu command, can be provided, such that the user selects a bus connectivity mode, in which only bussed connections are displayed. This can be used in connection with data path analysis, as discussed below.

Also, additional user input, for example another mouse click, can display a detailed menu of the contacts and connections, for instance using similar names as those in the netlist. The menu is displayed within a dialog box or in a separate window. The dialog box or window can have a descriptive header, for example Connectivity Analyzer, and can have standard window features, for example a slider bar for scrolling through long lists of named connections. Responsive to the user clicking on a named connection from the menu list, the selected connection is shown (for instance, highlighted or accompanied by additional detailed information) in the layout display. Also, the connection list menu window provides sorting and filtering capability. A search filter is provided, to allow the user to search for connections by typing the name, or by typing a name fragment and using wild card symbols, to search for sets of similarly-named connections, or to search for bussed multiple contacts as described above. In an embodiment, selecting a connection in the dialog box or list causes the corresponding connection to be highlighted in the circuit layout window.

Functions Associated with Logical Slices

As noted above, the modules 302, 306, and 310 of FIG. 3, and the sub-modules of the IC 306 that are broken out separately in FIG. 4, are also referred to as logical slices. In an embodiment, the user may also select a logical slice by mouse clicking, moving the mouse cursor onto the graphical representation of the module, etc. When such a module (logical slice) is thus selected, a menu of functions relating to information about the logical slice, and manipulation of the logical slice, can appear. For instance, the functions can include the following (details given as appropriate):

Highlight hard macros: This operation highlights macros belonging to the logical module.

Show detail information: This operation displays logical module information, for example number of standard cells, hard macros, pins or ports, and sub modules. It also shows if the module has a plan group associated with it, and if the module has been assigned for placement gravity list.

Change hierarchy color

Add to Gravity list: This operation adds the logical module to placement gravity list. Users can view hierarchy gravity modules under a pull-down menu, for example Task→Set Placement Hierarchy Gravity menu, to see all. The user can click an "OK" button to issue a suitable command, for example set_fp_placement_strategy command.

Create Plan Group: This operation creates a plan group for the selected logical module. Any plan groups belongs to the sub logical modules will be moved.

Merge to parent block: This operation merges the select module to its parent module. Any plan group belonging to the selected module and its sub modules will be deleted.

Split all children blocks: This operation splits all children modules from the selected module.

Split all children blocks with macros: This operation splits all children modules with macros from the selected module.

Split one child block: This operation splits one module block from the current module. The display will show flylines connecting the parent or child modules. The display window will also show flylines to its siblings, if there are any direct connections between the siblings.

Merge all children blocks: This operation merges the select module's children block. Any plan group belonging to sub modules will be deleted.

Copy macro placement: This operation allows users to copy the hard macro relative placement of another logical module. If the source module and destination modules have identical instance name (under respective logical module), the macro placement will be copied (relatively). Any unmatched macros will be ignored.

Note that, using an input action, for example a mouse right-click, the designer can split or otherwise subdivide sub-module children, for instance based on area, or on macro information.

Macro Generation, Editing and Manipulation

Often, physical designs utilize multiple occurrences of identical or similar circuit elements, logic devices, modules, or logical slices. Such elements (also referred to herein as "objects") can be implemented by the user as macros, to facilitate placing duplicates within the physical design. In particular, sometimes multiple occurrences of a module are grouped together as an array. The array of modules can itself be treated as a macro, so that each occurrence of the macro array includes the multiple occurrences of the modules making up the array. In an embodiment, a command pull-down menu, for example Task, can include a command Edit Macro Array, which prompts the user for input information, for example row and column configuration and spacing. A graphical array editor can be provided.

As noted in the above menu of functions, the multiple occurrences of a given macro can be highlighted, and copies of the macro can be placed as the user desires. A macro array editor can be provided, as a separate window, including for instance a physical design display sub-window and a list of macros, by one or more of name, and icon, from which the user can select. Manipulating a macro, for example ordering, scaling, and orientation of occurrences of a macro, can be user-controlled, for instance by click buttons in the editor window for grouping, flipping, rotating, shifting laterally, or sorting. A commit click button can be provided, for the user to use when the user is satisfied with the macro array formation shown in the physical design display window. The grouping function can be used when the user desires to lock in relative placement constraints for a macro array, such that any subsequent placement of another occurrence of the macro will have similar placement constraints. Within the macro array, the user can adjust individual spacing, for example row and column spacing between the modules, making up the array.

In an embodiment, a Macro Editor Toolbox is implemented as a separate window, which opens at user commend when a macro is selected, or otherwise is to be placed within a physical design. The Toolbox window provides click buttons to allow the user to perform tasks, for example aligning objects within the array (left, right, top, or bottom), distributing objects (left-to-right, right-to-left, top-to-bottom or bottom-to-top), rotate an object clockwise or counterclockwise, for instance in 90 degree increments, or flipping objects about the x- or the y-axes. Macros also can be grouped or ungrouped, for instance by selecting a set of modules, or an already-grouped macro, and then clicking on a group or ungroup button. When such a macro is created, a representation, for example a Linux RP script, can be generated, and then viewed, modified or saved.

Data Flow; Data Path Tracing and Analysis

A physical design for an IC, generated generally as described above and employing design system functionality such as that described above, can be analyzed to determine various data paths, through which data signals traverse as the IC operates. A given data path can be thought of as an overall path, through one or more of various logic gates, modules, components, and logical slices, and various interconnecting flylines connected between those modules. Given the desired functionality of the IC, it will generally be understood what data signals, in what quantity, will flow through such data paths.

Using various objective parameters, that is, factors for example gate count or overall component count, data signal throughput under various assumptions or expectations regarding operation of the IC, it is possible to quantify a weight index for the various data paths within the IC physical design. While such weight indices are calculated based on objective parameters such as those given above, it is also possible for the user to set weight indices subjectively, employing the user's subjective judgment regarding how the IC is to function.

In one embodiment, the resultant weight indices for data paths are provided to a placement engine, which employs the weight factors to position modules, and flylines between the modules, of the data path, to optimize the IC's performance (for example, operating speed, data throughput), or to achieve other desired objectives.

To give users performance information as a function of attributes of the physical design, for example macro placement within the floorplan, relative to data paths from input to output, in an embodiment there is an IO data path tracing capability.

For a given physical design, and/or for a given selected data path, a user enters a command to analyze the data flow. This may, for instance, be a command under a pull-down menu, the command having a descriptive title, for example analyze_data_flow. In response, the system might prompt the user, for instance with a dialog box, to enter a level of logic to be traced. The system traces logical pathway, starting from an input/output to the chip, up to the level of logic gates, until the analysis reaches any macro. Users then can select any macros and IO ports or cells, to see how many levels of logic are present, and to evaluate parameters relating to performance or cost resulting from the placement of the modules, macros, and flylines. Based on the results of such analysis for the given physical design, and module and macro placement relative to I/O ports, users can evaluate performance and quality of the resultant physical design, and then choose whether to modify or refine the physical design to get desired results.

Where the user has prepared multiple versions of a logical design, or where the logical design includes multiple similar features for example similar flylines (that is, connections between logical slices), the users can also filter flylines based on the results of the data flow analysis. For instance, the different results can indicate different costs or performance associated with the level of logic or placement of the different designs or features.

An Example of a Method of Operation

Figure 6:
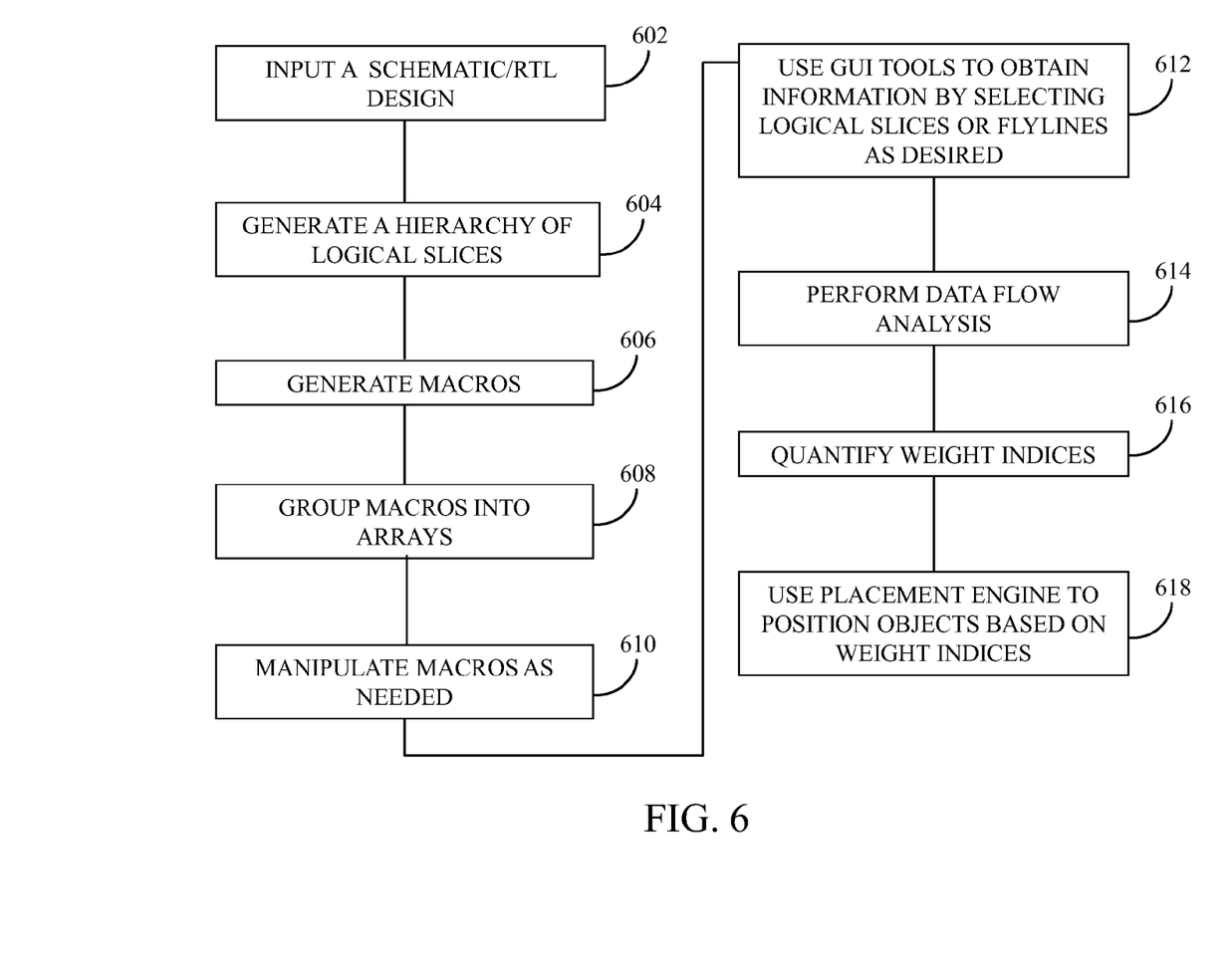
FIG. 6 is a flow diagram illustrating a method of generating a physical design of an integrated circuit, in accordance with one embodiment.

A method of generating a physical design of an integrated circuit, based on a schematic design, in accordance with an embodiment, is illustrated in FIG. 6 as a flow diagram. The method can, for instance, be practiced using a computer or a processing system, for example the computer 102 and the processing system 100.

At step 602, an integrated circuit schematic or RTL design is provided. The design starts out in a form, similar to that of FIG. 3, as input and output blocks, and an IC block. To enable the user to modularize the IC for better analysis and understanding, logical slices are created, for instance in hierarchical form, at step 604. The generation of logical slices is performed as generally described above, using GUI tools for user input.

At step 606, macros are generated. The macros can be defined as multiple occurrences of logical slices occur. Further, groups of identical or similar occurrences of macros are grouped as a macro array, in step 608, again using GUI tools and techniques for user input as described above. At step 610, additional manipulations of macros are performed as needed.

At step 612, throughout, GUI tools, for example mouse-clicking on objects and selection of functions from pull-down menus, can be used as needed, to obtain desired information.

At step 614, a data flow analysis, including data path tracing as needed, is then performed. This may include quantifying weight indices, at step 616, as discussed above, either by using objective factors, or by user input. Then, as appropriate, at step 618, information relating to weight indices is input to a placement engine for positioning objects in the physical design.

In the foregoing discussion, the term "coupled" refers to either a direct electrical connection between the devices connected or an indirect connection through intermediary devices.

The foregoing description sets forth numerous specific details to convey a thorough understanding of embodiments of the disclosure. However, it will be apparent to one skilled in the art that embodiments of the disclosure may be practiced without these specific details and enhancements may be made without departing from the spirit and scope of the claims that follow. Some well-known features are not described in detail in order to avoid obscuring the disclosure. Other variations and embodiments are possible in light of above teachings, and it is thus intended that the scope of disclosure not be limited by this Detailed Description.

What is claimed is:

1. One or more computer-readable non-transitory storage media embodying software comprising instructions operable when executed to:
    display, in a graphical user interface (GUI), a layout of an integrated circuit (IC), wherein the layout comprises a hierarchy of modules;
    receive a selection of a module in the hierarchy of modules;
    replace, in the displayed layout, the selected module with a plurality of sub-modules comprising, with respect to the hierarchy, children of the selected module;
    perform a data flow analysis, wherein the data flow analysis is based on a trace of data paths through the sub-modules; and
    display flylines in the GUI based on results of the data flow analysis.

2. The media of claim 1, the instructions being further operable when executed to:
    create logical slices of the IC based on a schematic design; and
    generate an analysis of the logical slices.

3. The media of claim 2, the instructions being further operable when executed to:
    create macros based on the analysis of the logical slices.

4. The media of claim 3, the instructions being further operable when executed to:
    group a subset of the macros in response to identification of multiple occurrences of logical slices.

5. The media of claim 3, the instructions being further operable when executed to:
    generate the layout of the IC based on the logical slices, the macros, and the data flow analysis.

6. The media of claim 5, the instructions to generate the layout of the IC comprising instructions operable when executed to:
    determine positions for the modules and interconnections between the modules to optimize a predetermined operating parameter for data paths through the modules and the interconnections.

7. The media of claim 6, wherein the positions for the modules and the interconnections are determined based on weight indices for the data paths through the modules and the interconnections, wherein the weight indices are quantified based on objective parameters or user input.

8. The media of claim 1, the instructions being further operable when executed to:
    receive a selection of one of the flylines, wherein the selected flyline represents connectivity between a first logical slice and a second logical slice; and
    display information about the connectivity between the first logical slice and the second logical slice.

9. The media of claim 1, the instructions being further operable when executed to:
    in response to user selection of a logical slice, display a menu of functions to display information about the logical slice and functions to manipulate the logical slice.

10. A method comprising:
    displaying, in a graphical user interface (GUI), a layout of an integrated circuit (IC), wherein the layout comprises a hierarchy of modules;
    replacing, in the displayed layout, a selected module in the hierarchy of modules with a plurality of sub-modules comprising, with respect to the hierarchy, children of the selected module;
    performing a data flow analysis, wherein the data flow analysis is based on a trace of data paths through the sub-modules; and
    displaying flylines in the GUI based on results of the data flow analysis.

11. The method of claim 10, further comprising:
    creating logical slices of the IC based on a schematic design; and
    generate an analysis of the logical slices.

12. The method of claim 11, further comprising:
    creating macros based on the analysis of the logical slices.

13. The method of claim 12, further comprising:
grouping a subset of the macros in response to identification of multiple occurrences of logical slices.

14. The method of claim 12, further comprising:
generating the layout of the IC based on the logical slices, the macros, and the data flow analysis.

15. The method of claim 13, the generating the layout of the IC further comprising:
determining positions for the modules and interconnections between the modules to optimize a predetermined operating parameter for data paths through the modules and the interconnections.

16. The method of claim 15, wherein the positions for the modules and the interconnections are determined based on weight indices for the data paths through the modules and the interconnections, wherein the weight indices are quantified based on objective parameters or user input.

17. The method of claim 10, further comprising:
receiving a selection of one of the flylines, wherein the selected flyline represents connectivity between a first logical slice and a second logical slice; and
displaying information about the connectivity between the first logical slice and the second logical slice.

18. The method of claim 10, further comprising:
in response to user selection of a logical slice, displaying a menu of functions to display information about the logical slice and functions to manipulate the logical slice.

19. A system comprising:
one or more processors; and
a memory coupled to the processors comprising instructions executable by the processors, the processors being operable when executing the instructions to:
display, in a graphical user interface (GUI), a layout of an integrated circuit (IC), wherein the layout comprises a hierarchy of modules;
receive a selection of a module in the hierarchy of modules;
replace, in the displayed layout, the selected module with a plurality of sub-modules comprising, with respect to the hierarchy, children of the selected module;
perform a data flow analysis, wherein the data flow analysis is based on a trace of data paths through the sub-modules; and
display flylines in the GUI based on results of the data flow analysis.

20. The system of claim 19, the instructions being further operable when executed to:
create logical slices of the IC based on a schematic design; and
generate an analysis of the logical slices.

21. The system of claim 20, the instructions being further operable when executed to:
create macros based on the analysis of the logical slices; and
generate the layout of the IC based on the logical slices, the macros, and the data flow analysis.

* * * * *

UNITED STATES PATENT AND TRADEMARK OFFICE
CERTIFICATE OF CORRECTION

| | | |
|---|---|---|
| PATENT NO. | : 8,843,865 B2 | Page 1 of 1 |
| APPLICATION NO. | : 13/405302 | |
| DATED | : September 23, 2014 | |
| INVENTOR(S) | : Philip H. Tai et al. | |

It is certified that error appears in the above-identified patent and that said Letters Patent is hereby corrected as shown below:

In the Claims

At column 11, claim 15, line 7
    Please delete "13," and insert -- "14," --

Signed and Sealed this
Sixth Day of January, 2015

Michelle K. Lee
*Deputy Director of the United States Patent and Trademark Office*